United States Patent [19]

Tseng

[11] Patent Number: 5,763,304
[45] Date of Patent: Jun. 9, 1998

[54] METHOD FOR MANUFACTURING A CAPACITOR WITH CHEMICAL MECHANICAL POLISHING

[75] Inventor: Horng-Huei Tseng, Hsinchu, Taiwan

[73] Assignee: Vanguard International Semiconductor Corporation, Hsinchu, Taiwan

[21] Appl. No.: 726,911

[22] Filed: Oct. 7, 1996

[51] Int. Cl.⁶ .................. H01L 21/8242; H01L 21/20
[52] U.S. Cl. .................. 438/239; 438/240; 438/254; 438/397
[58] Field of Search .................. 438/238, 239, 438/240, 253, 254, 381, 396, 397; 257/276, 306, 309, 310

[56] References Cited

U.S. PATENT DOCUMENTS

| | | |
|---|---|---|
| 5,021,357 | 6/1991 | Taguchi et al. . |
| 5,302,540 | 4/1994 | Ko et al. . |
| 5,340,763 | 8/1994 | Dennison ............ 438/398 |
| 5,374,580 | 12/1994 | Baglee et al. . |
| 5,405,796 | 4/1995 | Jones, Jr. ............ 438/253 |
| 5,552,334 | 9/1996 | Tseng ............ 438/397 |

*Primary Examiner*—Joni Chang
*Attorney, Agent, or Firm*—Christensen, O'Connor Johnson & Kindness PLLC

[57] ABSTRACT

A method of forming a capacitor on a semiconductor substrate includes forming a first oxide layer on the semiconductor substrate. A contact hole is then formed in the first oxide layer. A first conductive layer is formed on the first oxide layer and in the contact hole. Then the first conductive layer is etched back to the surface of said first oxide layer. A trench is formed in the first dielectric layer aligned with the first conductive layer, with the upper portion of the first conductive layer extending upwards from the bottom surface of the trench. A second conductive layer is conformally deposited on the first conductive layer and the first oxide layer. A second oxide layer is formed on the second conductive layer, filling the trench. A chemical mechanical polishing (CMP) process is then performed to remove the upper portions of the first and second oxide layers and the first and second conductive layers. The lower portions of the first and second oxide layers are removed by using a highly selective etching process. The resulting polysilicon structure serves as a bottom storage node of the capacitor. A dielectric film is formed on the first conductive layer and the second conductive layer. A third conductive layer is formed over the dielectric film to form the top storage node of the capacitor.

26 Claims, 4 Drawing Sheets

METHOD FOR MANUFACTURING A CAPACITOR WITH CHEMICAL MECHANICAL POLISHING

FIELD OF THE INVENTION

The present invention relates to methods of fabricating a semiconductor device, and more specifically, to methods of forming a Dynamic Random Access Memory (DRAM) cell. Still more particularly, the present invention relates to methods of forming a DRAM cell capacitor to reduce cell area and achieve high capacitance.

BACKGROUND OF THE INVENTION

It has been the trend in integrated circuit technology to increase the density of semiconductor devices per unit area of silicon wafer. However, this reduction in size can cause performance problems, especially for integrated circuit DRAM memory cells that use planar capacitors.

An integrated circuit DRAM device typically has many memory cells. Indeed, a memory cell is provided for each bit stored by the DRAM device. Each memory cell typically consists of a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a DRAM memory cell includes the formation of a transistor, a capacitor and contacts to external circuits. The capacitor type that has been typically used in DRAM memory cells are planar capacitors, because they are relatively simple to manufacture.

However, in order to achieve high density DRAM devices, the memory cells must be scaled down in size to the submicrometer range. This causes reduction in capacitor area, resulting in the reduction of cell capacitance. In this case, because the area of the charge storage capacitor is also decreased, the capacitance becomes relatively small. This decrease in storage capacitance leads to lowered signal-to-noise ratios and increased errors due to alpha particle interference.

Accordingly, for very small memory cells, planar capacitors become very difficult to use reliably. Additionally, as the capacitance decreases, the charge held by storage capacitor must be refreshed often. A simple stacked planar capacitor generally cannot provide sufficient capacitance for good performance, even with high performance dielectrics, such as $Ta_2O_5$.

Prior art approaches to overcoming these problems have resulted in the development of the trench capacitor (see for example U.S. Pat. No. 5,374,580) and the stacked capacitor (see for example U.S. Pat. No. 5,021,357). The trench capacitor has the well known problem of "gated diode leakage". Reducing the thickness of the dielectric also can improve the capacitance of the capacitor, but this approach is limited because of yield and reliability problems.

In another method, a capacitor over bit line (COB) cell with a hemispherical-grain (HSG-Si) polysilicon storage node has been developed (see "A CAPACITOR OVER BIT LINE CELL WITH HEMISPHERICAL-GRAIN STORAGE NODE FOR 64 Mb DRAMs", M. Sakao et al., Microelectronics Research Laboratories, NEC Corporation). The feature of the prior art is that a capacitor is formed by HSG-Si using "seeding method" to increase the area of the capacitor. Yet another prior capacitor cell has been disclosed in U.S. Pat. No. 5,302,540. This patent discloses a capacitor having a first conductive layer with a plurality of cylindrical sections, a dielectric layer over the first conductive layer, and a second conductive layer formed over the dielectric layer.

SUMMARY

In accordance with the present invention, a method of manufacturing a capacitor using a chemical mechanical polishing (CMP) process is provided. In one embodiment adapted for use in a DRAM cell, a substrate having a transistor, a bit line and a word line formed therein and thereon is provided. A first dielectric layer is then formed on the substrate. A second dielectric layer is subsequently formed on the first dielectric layer. The second dielectric layer is then planarized to provide a better topography for subsequent patterning and etching.

A contact hole is formed in the first and second dielectric layers, exposing a portion of source/drain region of the transistor. The contact hole is preferably formed to have the minimum width supported by the photolithography process. A first conductive layer is then formed on the second dielectric layer and in the contact hole, and on the second dielectric layer. The first conductive layer is preferably a doped polysilicon layer, which is then etched back to the surface of the second dielectric layer 24. The polysilicon filling the contact hole is thus substantially flush with the top surface of the second dielectric layer.

Afterwards, a photoresist is patterned on the second dielectric layer, leaving uncovered the top surface of the polysilicon layer and the surrounding portion of the second dielectric. An etching process is performed to anisotropically etch a trench into the second dielectric layer using the photoresist as an etching mask. In a preferred embodiment, a magnetic enhance reactive ion etching (MERIE) process is used that has a high selectivity between the dielectric material of the second dielectric layer and polysilicon. Thus, a relatively wide trench is formed in the second dielectric layer, with a polysilicon pillar extending vertically upwards from the bottom of the trench.

Next, the photoresist is removed and a second conductive layer is formed on the second dielectric layer and in the trench, covering the polysilicon pillar. Preferably, the second conductive layer is formed by conformal deposition of doped polysilicon. Next, a third dielectric layer is subsequently deposited on the second conductive layer. The third dielectric layer is preferably composed of silicon oxide.

Then a chemical mechanical polishing (CMP) process is used to removed an upper portion of the second and third dielectric layers, and the first and second conductive layers. The third dielectric layer provides lateral support for the first and second conductive layers during the CMP processes, thereby helping the unremoved lower portions of the first and second conductive layers to remain intact.

The second and third dielectric layers are then removed using an etching process having a high selectivity between the dielectric material (of the second and third dielectric layers) and the polysilicon of the first and second conductive layers, leaving the polysilicon structure intact. The first dielectric layer is made of a material that serves as an etching stopper. The resulting polysilicon structure serves as the bottom electrode of the capacitor. A dielectric film is then conformally deposited on the first and second polysilicon layers, serving as the capacitor dielectric. A third conductive layer is then deposited on the dielectric film to serve as the top electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

In the present invention, a new method is disclosed to fabricate a DRAM cell. The formation of the DRAM cell includes many process steps that are well known in the art. For example, the process of photolithography masking and etching is used extensively in several embodiments of the present invention. One standard photolithography process includes creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and then stripping the remaining photoresist. This photolithography masking and etching process is referred to herein as "patterning and etching". Another well known process that is used extensively in this and many other integrated circuit fabrication processes is chemical mechanical polishing (CMP). These and other standard processes are referred to extensively herein without a detailed discussion of well known technologies.

Figure 1:
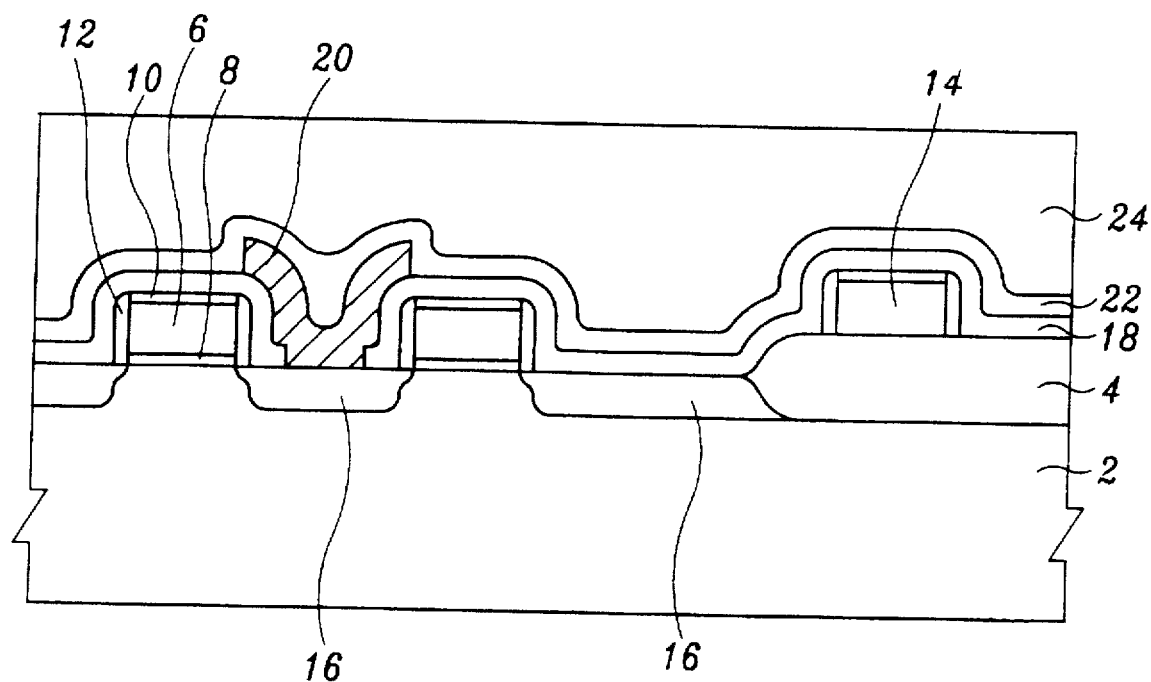
FIG. 1 is a cross-sectional view of a semiconductor wafer illustrating the steps of forming a gate structure, an isolation layer, a nitride layer, a second dielectric layer and a first dielectric layer on a substrate, according to one embodiment of the present invention.

Referring to FIG. 1, a single crystal silicon substrate 2 with a <100> crystallographic orientation is provided. Transistors, word lines and bit lines are formed in and on the substrate 2 in any suitable manner. In one embodiment, the transistor, word lines and bit lines are formed as follows.

A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 4000–6000 angstroms.

Next, a silicon dioxide layer 6 is created on the top surface of the substrate 2 to serve as the gate oxide for subsequently formed Metal Oxide Silicon Field Effect Transistors (MOSFETs). In this embodiment, the silicon dioxide layer 6 is formed by using an oxygen-steam ambient, at a temperature of about 850–1000° C. Alternatively, the oxide layer 6 may be formed using any suitable oxide chemical compositions and procedures. In this embodiment, the silicon dioxide layer 6 is formed to a thickness of approximately 100 angstroms.

A first polysilicon layer 8 is then formed over the FOX region 4 and the silicon dioxide layer 6 using a Low Pressure Chemical Vapor Deposition (LPCVD) process. The first polysilicon layer 8 is doped in order to form a conductive gate for the MOSFET structure. In this embodiment, the first polysilicon layer 8 has a thickness of about 2000–3500 angstroms and is doped with $P^{31}$ dopants at a concentration of about 1E19–1E21 atoms/cm$^3$. A capped oxide layer 10 is formed on the first polysilicon layer 8 to a thickness aboout 500–1200 angstroms using CVD. Next, standard photolithography and etching process are performed to form a gate structure and a word line 14. Sidewall spacers 12 are subsequently formed on the sidewalls of the first polysilicon layer. Thereafter, active regions 16 (i.e., MOSFET's source and drain) are formed, using well known processes to implant appropriate impurities in those regions and activate the impurities. In view of this disclosure, those skilled in the art of DRAM fabrication can modify this embodiment to form lightly doped drain (LDD) structures, without undue experimentation.

A first dielectric layer 18 is deposited on the gate structure and the substrate 2 for isolation. The first dielectric layer 18 in the preferred embodiment is composed of silicon dioxide formed using a standard CVD process to a thickness of about 1500 angstroms. The first dielectric layer 18 is patterned and etched to form a contact window over one of the source/drain regions 16. A metal layer is then deposited on the first dielectric layer and the exposed portion of the source/drain region. The metal layer is then patterned and etched to form a bit line 20.

A nitride layer 22 is then formed on the bit line 20 and the first dielectric layer 18 using a standard CVD process. This nitride layer 22 is preferably about 1500 angstroms, but any thickness in the range of 1000 to 2500 angstroms can be used. The nitride layer 22 provides isolation for the transistor and bit line structures and also serves as an etching stopper in subsequent processing.

A second dielectric layer 24 is subsequently formed on the nitride layer 22. The second dielectric layer 24 can be formed of any suitable material such as, for example, silicon oxide. Preferably, the second dielectric layer 24 is formed using a conventional CVD process. The thickness of the second dielectric layer 24 is about 6000 angstroms, but can be any suitable thickness in the range of 4000 to 10000 angstroms. The second dielectric layer 24 is then planarized. In this embodiment, a CMP process is used, although any suitable planarizing process may be used in other embodiments. The planarization improves the topography for the next photolithography step.

Figure 2:
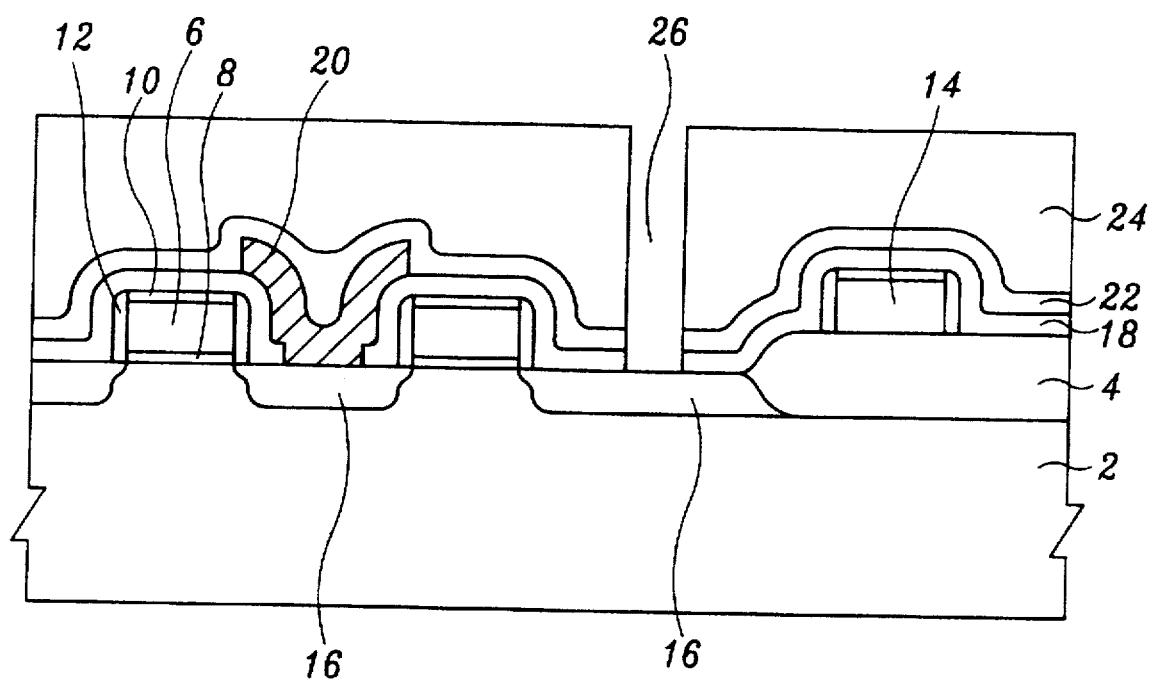
FIG. 2 is a cross-sectional view of a semiconductor wafer illustrating the steps of forming a contact hole in the isolation layer, the nitride layer, the second dielectric layer and the first dielectric layer, according to one embodiment of the present invention.

As shown in FIG. 2, a contact hole 26 is then formed through the second dielectric layer 24, the nitride layer 22 and the first dielectric layer 18 to expose a portion of one of the source/drain regions 16. In this embodiment, a standard patterning and etching process is performed to form the contact hole 26 to have the minimum width supported by the photolithography process. The planarization process performed on the second dielectric layer 24 facilitates the formation of the minimum width contact hole.

Figure 3:
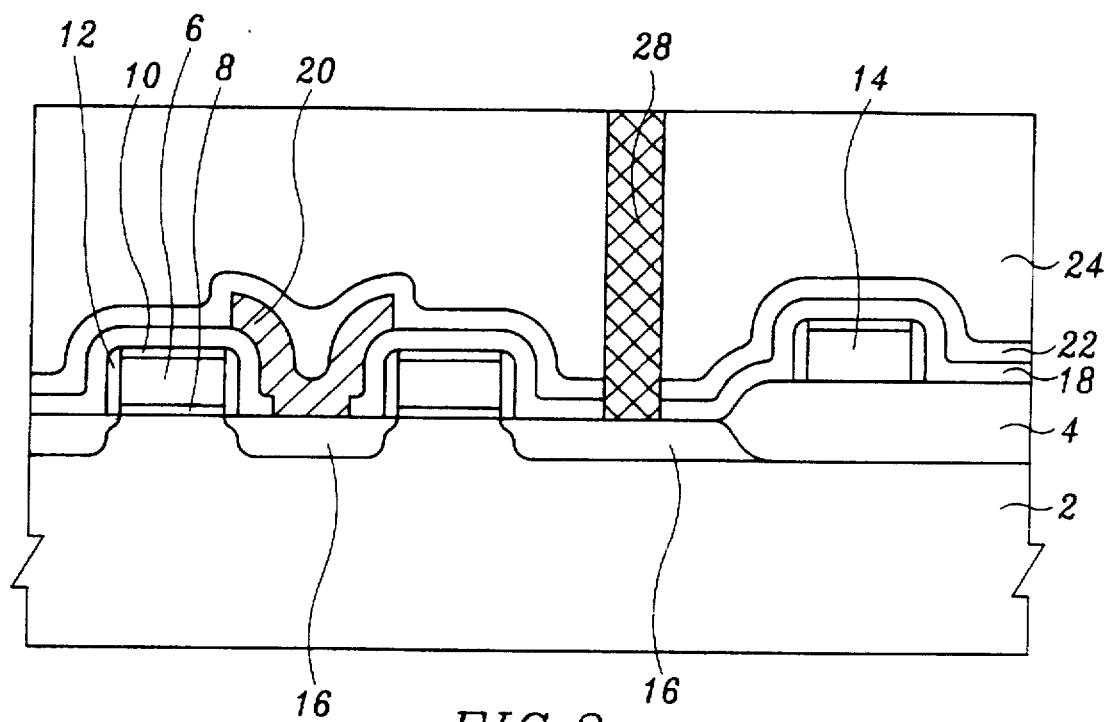
FIG. 3 is a cross-sectional view of a semiconductor wafer illustrating the steps of forming a second polysilicon layer and a second dielectric layer on the substrate, according to one embodiment of the present invention.

Turning to FIG. 3, a second polysilicon layer 28 is then formed on the second dielectric layer 24 and in the contact hole 26. The second polysilicon layer 28 preferably completely fills the contact hole 26. In the preferred embodiment, the second polysilicon layer 28 is formed using conventional LPCVD processing. The thickness of the second polysilicon layer 28 on the top surface of the second dielectric layer 24 is about 1000 angstroms. The second polysilicon layer 28 is doped with $p^{31}$ dopants with a concentration of about 1E20atoms/cm$^3$ to increase conductivity. Any suitable method may be used to dope the polysilicon such as, for example, in-situ doping. Afterward, a reactive ion etching (RIE) process is used to etch back the second polysilicon layer 28 to the surface of the second dielectric layer 24. Consequently, the top surface of the residual polysilicon layer 28 is approximately even with the top surface of the second dielectric layer 24. In this embodiment, this RIE process uses a $SF_6+HBr+O_2$ chemistry etchant.

Figure 4:
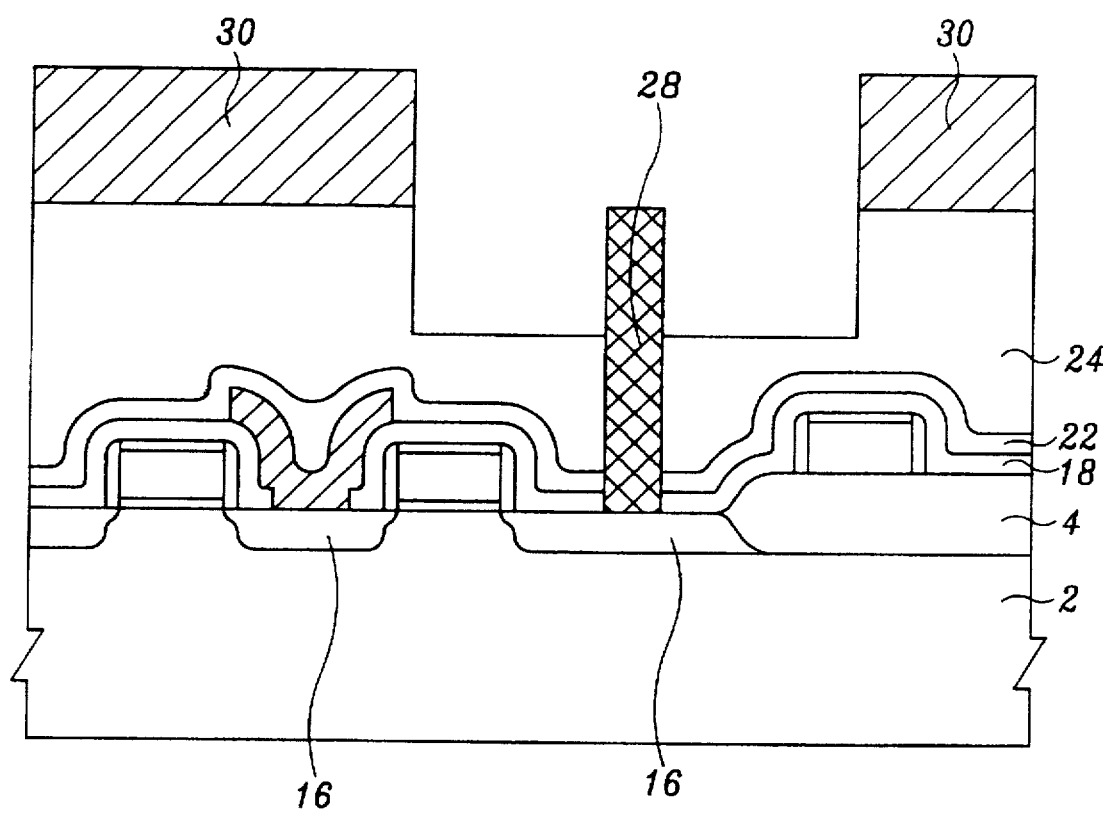
FIG. 4 is a cross-sectional view of a semiconductor wafer illustrating the step of etching the second dielectric layer according to one embodiment of the present invention.

As seen in FIG. 4, a wide trench 29 is then formed in the second dielectric layer 24, preferably aligned with the a photoresist 30. To form this trench, a photoresist layer is formed on the second dielectric layer 24 and the second polysilicon layer 28. Then the photoresist layer is patterned to uncover the second polysilicon layer 28 and a portion of the second dielectric layer 24 surrounding the polysilicon layer 28, forming the photoresist mask 30. An anisotropic etching process is then performed using the photoresist 30 as an etching mask, thereby forming the wide trench 29.

In preferred embodiment, a magnetic enhanced reactive ion etching (MERIE) process is used to form the trench 29. In this embodiment, the MERIE process uses an etchant composed of $CF_4$, $O_2$, $CHF_3$, and Ar. This etching process has a relatively high etching selectivity between the dielectric material of the dielectric layer 24 and the doped polysilicon of the polysilicon layer 28 (e.g., having a the selectivity ratio of about 15 to 1). Accordingly, the polysilicon layer 28 remains substantially intact, rising vertically from the bottom of the trench 29.

Figure 5:
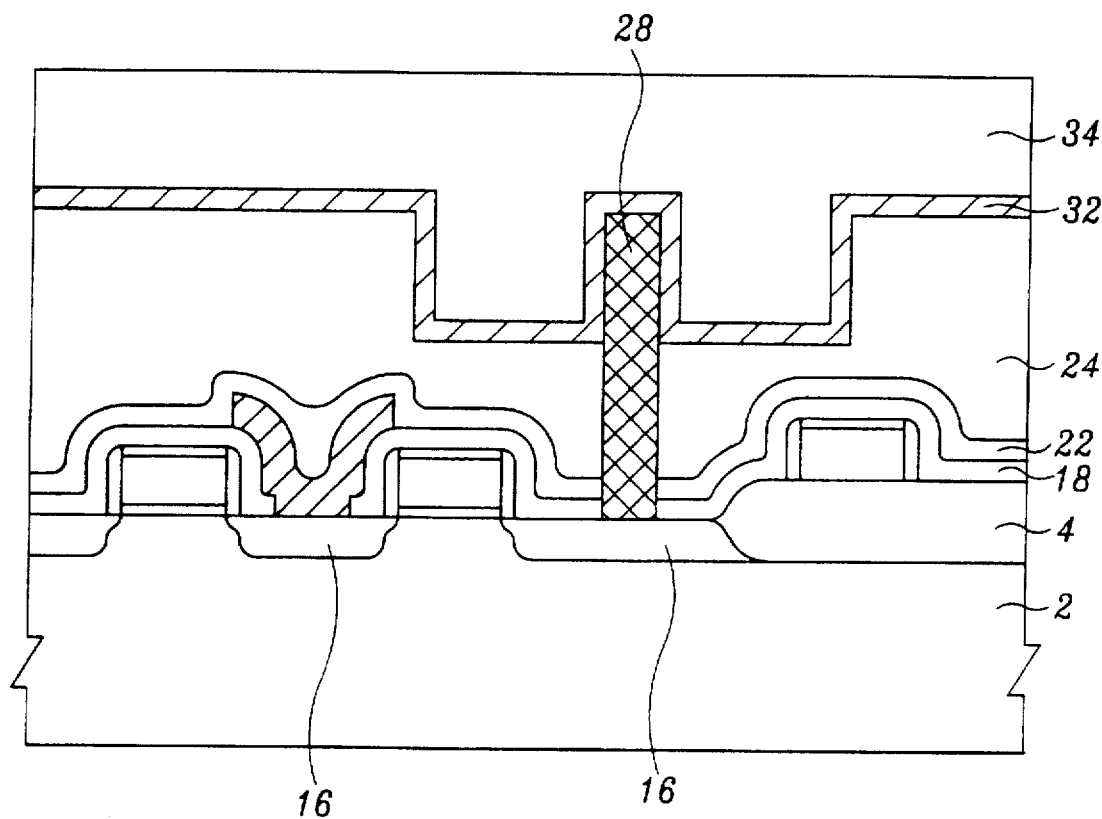
FIG. 5 is a cross-sectional view of a semiconductor wafer illustrating the steps of forming a third polysilicon layer and third dielectric layer, according to one embodiment of the present invention.

Next, as seen in FIG. 5, the photoresist 30 is removed and a third polysilicon layer 32 is conformally formed on the second dielectric layer 24, in the trench 29 and on the second polysilicon layer 28. The third polysilicon layer 32 is formed using a standard LPCVD process to a thickness of about 500–2000 angstroms. Similarly, the third polysilicon layer 32 is preferably in-situ doped polysilicon with the same dopants and concentration of the second polysilicon layer 28.

Next, a third dielectric layer 34 is deposited on the third polysilicon layer 32, using a standard CVD process to deposit silicon oxide. In this embodiment, the thickness of the third dielectric layer 34 is about 2500 angstroms, although any thickness in the range of about 1000 to 4000 angstroms can be used. The third dielectric layer 34 serves to provide lateral support to the polysilicon layers in the trench 29 during subsequent CMP processing. Thus, the third dielectric layer 34 preferably completely fills the trench 29.

Figure 6:
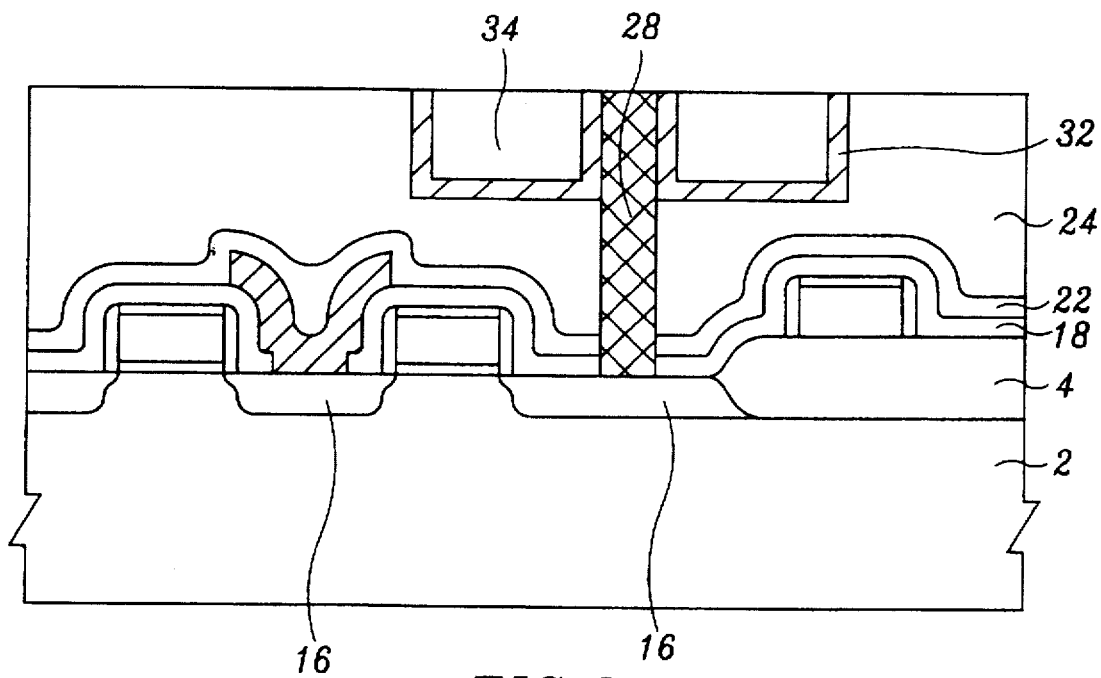
FIG. 6 is a cross-sectional view of a semiconductor wafer illustrating the step of performing a CMP process to remove a portion of the third dielectric layer, a portion of the second polysilicon layer and a portion of the second dielectric layer, according to one embodiment of the present invention.

Referring to FIG. 6, the upper portion of the third dielectric layer 34, third polysilicon layer 32 and polysilicon layer 28 is removed by using a CMP process. The CMP process is stopped approximately when the top surface (i.e., the surface not including the trench 29) of the second dielectric layer 24 is exposed. Preferably, the top surface is slightly over polished to ensure that the top surface of the second dielectric layer 24 is completely exposed.

Figure 7:
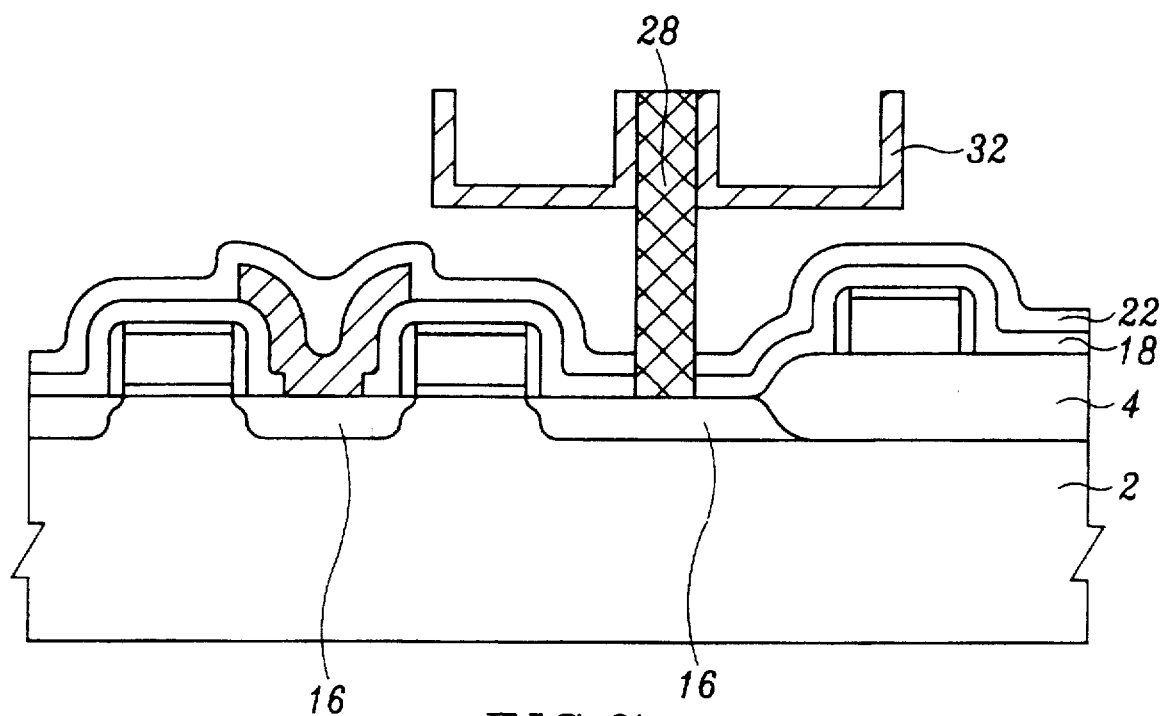
FIG. 7 is a cross-sectional view of a semiconductor wafer illustrating the step of removing the second dielectric layer and the third dielectric layer, according to one embodiment of the present invention.

As shown in FIG. 7, the second and third dielectric layers 24 and 34 are then removed, leaving the polysilicon structure formed by the polysilicon layers 28 and 32 intact. This polysilicon structure serves as the bottom electrode of an integrated circuit capacitor. An etching process having a high etching selectivity between oxide and polysilicon (e.g., having a selectivity ratio of about 100-to-1 or greater) is used. In this embodiment, the etching process uses an etchant with HF to attack the silicon oxide while not affecting the integrity of the polysilicon structure. In addition, the HF etchant leaves the nitride layer 22 substantially intact. The structure formed by the polysilicon layer 32 adds more surface area to the bottom electrode, thereby increasing the capacitance of the capacitor. Further, because the contact hole 26 (FIG. 2) has a width of about the minimum dimension of the photolithography process, the bottom electrode occupies a relatively small area of the substrate 2.

Figure 8:
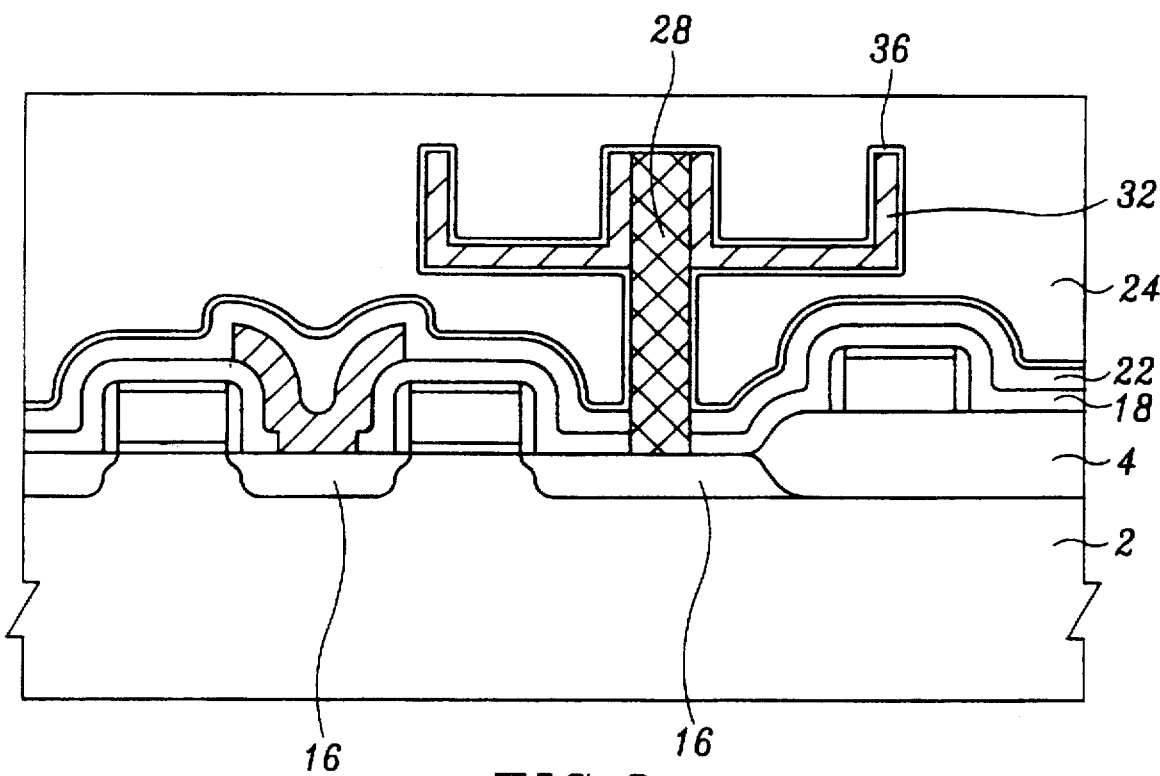
FIG. 8 is a cross-sectional view of a semiconductor wafer illustrating the steps of forming a dielectric film and a third polysilicon layer, according to one embodiment of the present invention.

Turning to FIG. 8, a dielectric film 36 is then conformally deposited on bottom electrode formed by the second and third polysilicon layers 28 and 32. The dielectric film 36 can be formed of a nitride/oxide double film, an oxide/nitride/oxide triple film, or any other high dielectric film such as tantalum oxide ($Ta_2O_5$). Afterwards, a fourth polysilicon layer 38 is deposited on the dielectric film 36 using a conventional LPCVD process. Preferably, the fourth polysilicon layer 38 is doped in the same manner as the second polysilicon layer 28. The fourth in-situ doped polysilicon layer 38 is then patterned and etched to form a top storage electrode for the capacitor. Thus, a semiconductor capacitor is formed which has relatively large electrode surface area while occupying a relatively small area of the substrate. Therefore a capacitor according to the present invention not only has a relatively large capacitance, but also has a relatively small layout area, thereby supporting good performance and high density.

As will be understood by persons skilled in the art, the foregoing embodiments of the present invention are illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method of forming a capacitor on a semiconductor substrate, said method comprising:

forming a first dielectric layer on said semiconductor substrate;

forming a contact hole in said first dielectric layer to said substrate;

forming a first conductive layer on said first dielectric layer, wherein said first conductive layer substantially completely fills said contact hole;

etching said first conductive layer, wherein a top surface of said first dielectric layer is exposed, said contact hole remaining substantially filled by said first conductive layer;

forming and patterning a photoresist layer on said first dielectric layer, wherein a photoresist mask is formed that exposes a top surface of said first conductive layer and a surrounding portion of said top surface of said first dielectric layer, said surrounding portion of said top surface of said first dielectric layer surrounding said top surface of said first conductive layer;

etching said surrounding portion of said first dielectric layer using said photoresist mask as an etching mask, wherein a trench is formed in said first dielectric layer surrounding said first conductive layer, whereby an upper portion of said first conductive layer extends upwards from a bottom of said trench;

removing said photoresist;

forming a second conductive layer on said upper portion of said first conductive layer and on said first dielectric layer and in said trench;

forming a second dielectric layer on said second conductive layer and substantially completely filling said trench;

removing an upper portion of said second dielectric layer, said second conductive layer, said first dielectric layer and said first conductive layer by performing a chemical mechanical polishing (CMP) process;

removing said first dielectric layer and said second dielectric layer while leaving said first and second conductive layers substantially intact, wherein said first and second conductive layers form a bottom storage node of said capacitor;

forming a dielectric film on said first conductive layer and said second conductive layer; and forming a third conductive layer on said dielectric film, wherein said third conductive layer serves as a top storage node of said capacitor.

2. The method of claim 1, wherein said first dielectric layer comprises a silicon oxide.

3. The method of claim 2, wherein said first dielectric layer is formed to have a thickness of approximately 4000–10000 angstroms.

4. The method of claim 1, wherein said first conductive layer comprises doped polysilicon.

5. The method of claim 4, wherein said first conductive layer comprises in-situ doped polysilicon.

6. The method of claim 1, wherein said etching said surrounding portion of said first dielectric layer comprises etching said surrounding portion of said first dielectric layer using a magnetic enhanced reactive ion etching (MERIE) process.

7. The method of claim 6, wherein said MERIE process comprises using an etchant including $CF_4$, $O_2$, $CHF_3$, and Ar.

8. The method of claim 1, wherein said removing said first dielectric layer and said second dielectric layer while leaving said first and second conductive layers substantially intact comprises using an etchant including HF.

9. The method of claim 1, wherein said second conductive layer comprises a doped polysilicon layer having a thickness in a range of about 500 to 2000 angstroms.

10. The method of claim 9, wherein said second conductive layer comprises in-situ doped polysilicon.

11. The method of claim 1, wherein said third conductive layer comprises doped polysilicon.

12. The method of claim 11, wherein said third conductive layer comprises in-situ doped polysilicon.

13. The method of claim 1, wherein said second dielectric layer comprises silicon oxide.

14. The method of claim 13, wherein said second dielectric layer is formed to have a thickness of approximately 1000–4000 angstroms.

15. The method of claim 1, wherein said dielectric film comprises tantalum oxide ($Ta_2O_5$).

16. The method of claim 1, wherein said dielectric film comprises an oxide/nitride/oxide triple film.

17. The method of claim 1, wherein said dielectric film comprises a nitride/oxide double film.

18. The method of claim 1, wherein before said forming a first dielectric layer on said semiconductor substrate, said method further comprises:

forming a field oxide (FOX) region on said substrate;

forming a silicon dioxide layer on said substrate, said silicon dioxide layer serving as a gate oxide for a transistor;

forming a fourth conductive layer over said FOX region and said silicon dioxide layer, said fourth conductive layer comprising doped polysilicon;

patterning and etching said fourth conductive layer to form a gate structure for said transistor;

doping selective regions of said substrate to form source and drain regions in said substrate for said transistor;

forming a third dielectric layer on said gate structure and said substrate;

forming a contact window in said third dielectric layer exposing a portion of said substrate;

forming a metal layer on said third dielectric layer and in said contact window;

patterning and etching said metal layer to form a bit line; and forming a nitride layer on said third dielectric layer and said bit line.

19. A method of forming a polysilicon structure on a semiconductor substrate, said method comprising:

forming a first oxide layer on said semiconductor substrate;

forming a contact hole in said first oxide layer to said substrate;

forming a first doped polysilicon layer on said first oxide layer, wherein said first doped polysilicon layer substantially completely fills said contact hole;

etching said first doped polysilicon layer, wherein a top surface of said first oxide layer is exposed, said contact hole remaining substantially filled by said first doped polysilicon layer;

forming and patterning a photoresist layer on said first oxide layer, wherein a photoresist mask is formed that exposes a top surface of said first doped polysilicon layer and a surrounding portion of said top surface of said first oxide layer, said surrounding portion of said top surface of said first oxide layer surrounding said top surface of said first doped polysilicon layer;

etching said surrounding portion of said first oxide layer using said photoresist mask as an etching mask, wherein a trench is formed in said first oxide layer surrounding said first doped polysilicon layer, whereby an upper portion of said first doped polysilicon layer extends upwards from a bottom of said trench;

removing said photoresist;

forming a second doped polysilicon layer on said upper portion of said first doped polysilicon layer and on said first oxide layer and in said trench;

forming a second oxide layer on said second doped polysilicon layer and substantially completely filling said trench;

removing an upper portion of said second oxide layer, said second doped polysilicon layer, said first oxide layer and said first doped polysilicon layer by performing a chemical mechanical polishing (CMP) process; and removing said first oxide layer and said second oxide layer while leaving said first and second doped polysilicon layers substantially intact, wherein said first and second doped polysilicon layers form a bottom storage node of a capacitor.

20. The method of claim 19, further comprising planarizing said first oxide layer before forming said contact hole.

21. The method of claim 19, wherein etching said surrounding portion of said first oxide layer using said photoresist mask as an etching mask comprises a MERIE process.

22. The method of claim 21, wherein said MERIE process comprises using an etchant comprising $CF_4$, $O_2$, $CHF_3$, and Ar.

23. The method of claim 19, wherein said removing said first oxide layer and said second oxide layer while leaving said first and second doped polysilicon layers substantially intact comprises etching said first and second oxide layers with an etchant comprising HF.

24. The method of claim 19, wherein said second doped polysilicon layer is conformally deposited with a thickness in a range of about 500 to 2000 angstroms.

25. The method of claim 19, further comprising forming a nitride layer beneath said first oxide layer.

26. The method of claim 19, wherein said first oxide layer is formed to have a thickness of approximately 4000–10000 angstroms.

* * * * *